United States Patent
Subramanian et al.

[11] Patent Number: 6,060,380
[45] Date of Patent: May 9, 2000

[54] ANTIREFLECTIVE SILICONOXYNITRIDE HARDMASK LAYER USED DURING ETCHING PROCESSES IN INTEGRATED CIRCUIT FABRICATION

[75] Inventors: Ramkumar Subramanian, San Jose; Bhanwar Singh, Morgan Hill; Simon Chan, Saratoga; Fei Wang, San Jose, all of Calif.

[73] Assignee: Advanced Micro Devices, Inc., Sunnyvale, Calif.

[21] Appl. No.: 09/187,391

[22] Filed: Nov. 6, 1998

[51] Int. Cl.[7] .................................................. H01L 21/4763
[52] U.S. Cl. ........................ 438/618; 438/622; 438/624; 438/666; 438/667; 438/669; 438/671; 438/672
[58] Field of Search .................................... 438/618, 622, 438/624, 666, 667, 671, 672, 669

[56] References Cited

U.S. PATENT DOCUMENTS

| | | | |
|---|---|---|---|
| 5,612,254 | 3/1997 | Mu et al. | 437/195 |
| 5,635,423 | 6/1997 | Huang et al. | 437/195 |
| 5,686,354 | 11/1997 | Avanzino et al. | 437/190 |
| 5,753,967 | 5/1998 | Lin | 257/635 |
| 5,817,572 | 10/1998 | Chiang et al. | 438/624 |
| 5,936,707 | 8/1999 | Nguyen et al. | 355/18 |

OTHER PUBLICATIONS

C.W. Kaanta, S.G. Bombardier, W.J. Cote, W.R. Hill, G. Kerszykowski, H.S. Landis, D.J. Poindexter, C.W. Pollard, G.H. Ross, J.G. Ryan, S. Wolff, and J.E. Cronin, Dual Damascene: A ULSI Wiring Technology, IEEE VMIC Conference, Jun. 11–12, 1991, pp. 144–152.

*Primary Examiner*—John F. Niebling
*Assistant Examiner*—Lynne A. Gurley
*Attorney, Agent, or Firm*—Monica H. Choi

[57] ABSTRACT

A method for etching openings in an integrated circuit uses siliconoxynitride as a hardmask layer. Because of the relatively low reflectivity of siliconoxynitride, when a photoresist layer is deposited on the siliconoxynitride hardmask layer and is exposed to light, the photoresist layer is patterned more conformingly to a desired pattern. The present invention may be used to particular advantage for etching contiguous trench lines and via holes in a dual damascene etch process for small dimension integrated circuits.

8 Claims, 6 Drawing Sheets

ANTIREFLECTIVE SILICONOXYNITRIDE HARDMASK LAYER USED DURING ETCHING PROCESSES IN INTEGRATED CIRCUIT FABRICATION

TECHNICAL FIELD

This invention relates to integrated circuit fabrication, and more particularly, to a method for using antireflective siliconoxynitride as a hardmask layer during etching processes in integrated circuit fabrication.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

As the dimension of metal lines are scaled down, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

Figure 1:
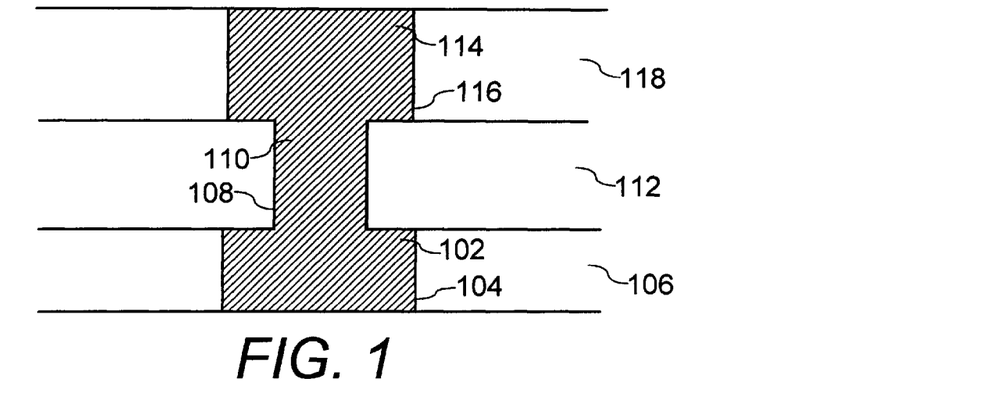
FIG. 1 shows a cross-sectional view of dual damascene metallization on an integrated circuit.

The location and size of copper metallization on an integrated circuit is defined using a damascene etch process because copper cannot be readily patterned using conventional reactive ion etching techniques. Referring to FIG. 1, a multi-level copper metallization structure in an integrated circuit includes a bottom copper line 102 defined within a bottom trench-line 104 in a bottom insulating layer 106. After deposition of copper onto the integrated circuit having the bottom trench line 104, the surface of the integrated circuit is polished to remove the copper deposited on the surface of the integrated circuit and to confine the copper to be within the bottom trench line 104.

Figure 2:
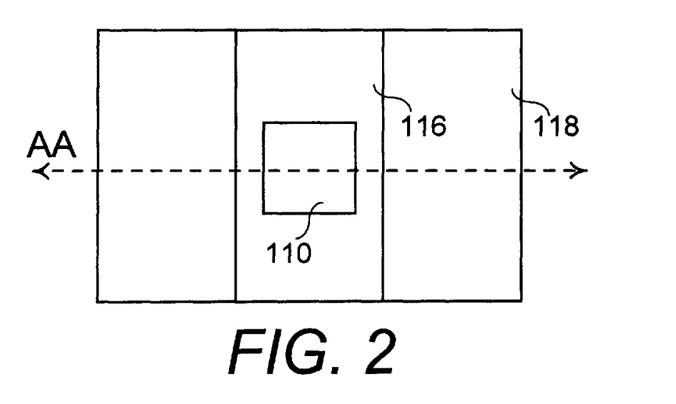
FIG. 2 shows a top view of the dual damascene metallization of FIG. 1.

After polishing the integrated circuit surface, a copper via plug 108, defined within a via hole 110 in a via insulating layer 112, and a top copper line 114, defined within a top trench line 116 in a top insulating layer 118, are added. The top copper line 114 is on a different metallization level from the bottom copper line 102, and the via plug 108 interconnects the copper lines 102 and 114 on the different metallization levels. FIG. 2 shows a top-view of the damascene metallization structure of FIG. 1, and the cross-sectional view of FIG. 1 is taken along line AA of FIG. 2.

In a dual damascene etch process, the via hole 110 and the top trench line 116 are etched out to form contiguous openings before copper is deposited into the via hole 110 and the top trench line 116. Hardmask layers are used in the dual damascene etch process for etching out the via hole 110 and the top trench line 116.

Figure 3:
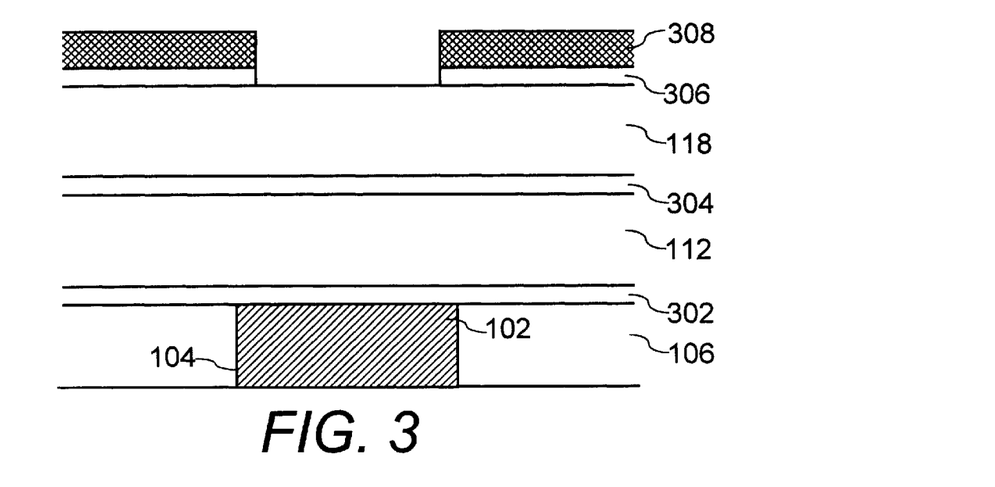
FIG. 3 shows a cross-sectional view of insulating layers having hardmasks deposited thereon for defining openings within the insulating layers.

In a damascene etch process, hardmask layers are used to define openings in insulating layers. Referring to FIG. 3, a bottom hardmask layer 302 is deposited on the bottom insulating layer 106 to define the bottom wall of the via hole 110. In addition, a via hardmask layer 304 is deposited on the via insulating layer 112 to define the via hole 110. Also, a top hardmask layer 306 is deposited on the top insulating layer 118 to define the location and size of trench lines in the top insulating layer 118.

During etching of the trench lines and via holes, a photoresist layer 308 is deposited on the top hardmask layer 306 which is the top-most layer of the integrated circuit. As known to one of ordinary skill in the art of integrated circuit fabrication, the photoresist layer is exposed to light for defining the pattern of openings to be etched in the layers below the photoresist layer 308. If the top hardmask layer 306 which abuts the photoresist layer 308 is antireflective to the light used for exposing the photoresist layer 308, then the patterning of the photoresist layer 308 from such light conforms better to a desired pattern. Such high conformance is especially important for small dimension integrated circuit fabrication.

The present invention is described for etching a dual damascene opening having a trench line and a via hole for integrated circuit metallization. However, one of ordinary skill in the art may readily use the present invention for etching any type of opening with a hardmask within an integrated circuit from the description herein.

SUMMARY OF THE INVENTION

Accordingly, the present invention uses siliconoxynitride as the top hardmask layer which abuts the photoresist layer deposited for defining openings within an integrated circuit.

In a general aspect, the present invention is a method for etching at least one opening in an integrated circuit by depositing a siliconoxynitride hardmask layer over a first insulating layer. The method also includes the step of depositing a first photoresist layer over the siliconoxynitride hardmask layer for defining a first pattern in the siliconoxynitride hardmask layer. The first pattern determines a location and size of openings in the first insulating layer. In addition, the method includes the step of exposing the first photoresist layer with light for defining the first pattern in the first photoresist layer. The siliconoxynitride hardmask layer is antireflective to such light used for exposing the first photoresist layer. The method further includes the steps of etching the first pattern in the first photoresist layer and etching the first pattern of openings in the siliconoxynitride hardmask layer as defined from the etching of the first photoresist layer.

The present invention may be used to particular advantage for etching openings in a plurality of insulating layers. In that case, the present invention also includes the step of removing the first photoresist layer and depositing a second photoresist layer over the siliconoxynitride hardmask layer. The second photoresist layer is used to define a second pattern that determines a location and size of openings in a second insulating layer that is below the first insulating layer. In addition, the present invention further includes the step of exposing the second photoresist layer with light for defining the second pattern in the second photoresist layer. The siliconoxynitride hardmask layer is antireflective to the light used for exposing the second photoresist layer. The present invention also includes the step of etching the second pattern in the second photoresist layer and etching the second pattern of openings through the first insulating layer as defined from the etched second photoresist layer. The present invention may also include the steps of removing the second photoresist layer and etching the first pattern of openings through the first insulating layer and etching the second pattern of openings through the second insulating layer.

By using the siliconoxynitride as the top most hardmask layer which is antireflective of light used for exposing any photoresist layers deposited on such hardmask layer, the openings etched in the integrated circuit conform better to desired size and location.

The present invention may be used to particular advantage when the first pattern defines trench lines within the first insulating layer, and when the second pattern defines via holes within the second insulating layer. The trench lines and via holes may be contiguous openings in a dual-damascene metallization structure.

These and other features and advantages of the present invention will be better understood by considering the following detailed description of the invention which is presented with the attached drawings.

BRIEF DESCRIPTION OF THE DRAWINGS

FIG. 4, including FIG. 5, including

The figures referred to herein are drawn for clarity of illustration and are not necessarily drawn to scale. Moreover, the figures referred to herein focus on openings that are part of a larger integrated circuit. Elements having the same reference number in FIGS. 1–5 refer to elements having similar structure and function.

DETAILED DESCRIPTION

The present invention is described for etching openings for dual damascene metallization including trench lines and via holes. However, as would be apparent to one of ordinary skill in the art, the present invention may be used for etching any type of opening using a hardmask within an integrated circuit.

Figure 4A:
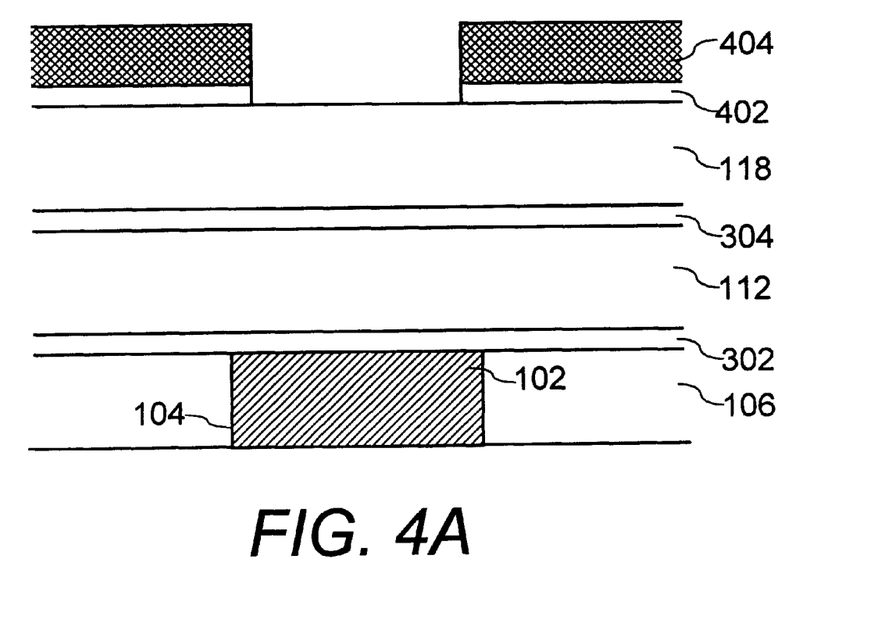
FIGS. 4A, 4B, 4C, 4D, 4E, 4F, and 4G, illustrates the steps for etching a trench-line and a via hole in a dual damascene etch process using a siliconoxynitride hardmask layer, according to the present invention.

Referring to FIGS. 3 and 4A, regions having the same reference numbers are similar in shape and function. In FIG. 4A, a top hardmask layer 402 is comprised of siliconoxynitride (having chemical formula SiON) according to the present invention. A siliconoxynitride hardmask layer is relatively antireflective to light when compared to other types of hardmask layers such as a silicon nitride (having chemical formula SiN) hardmask layer.

Figure 5A:
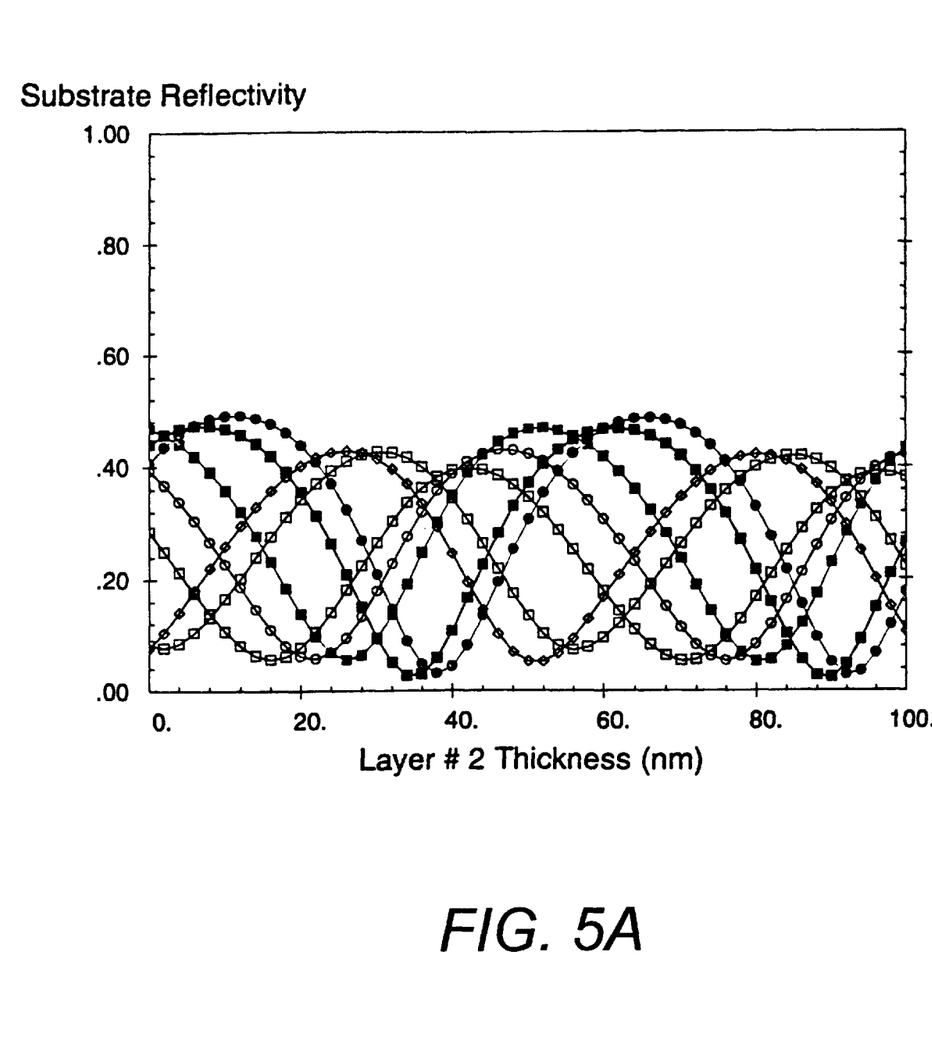
FIGS. 5A and 5B, shows graphs of reflectivity of a silicon nitride hardmask layer and a siliconoxynitride hardmask layer, respectively, versus the thickness of the hardmask layer.
Figure 5B:
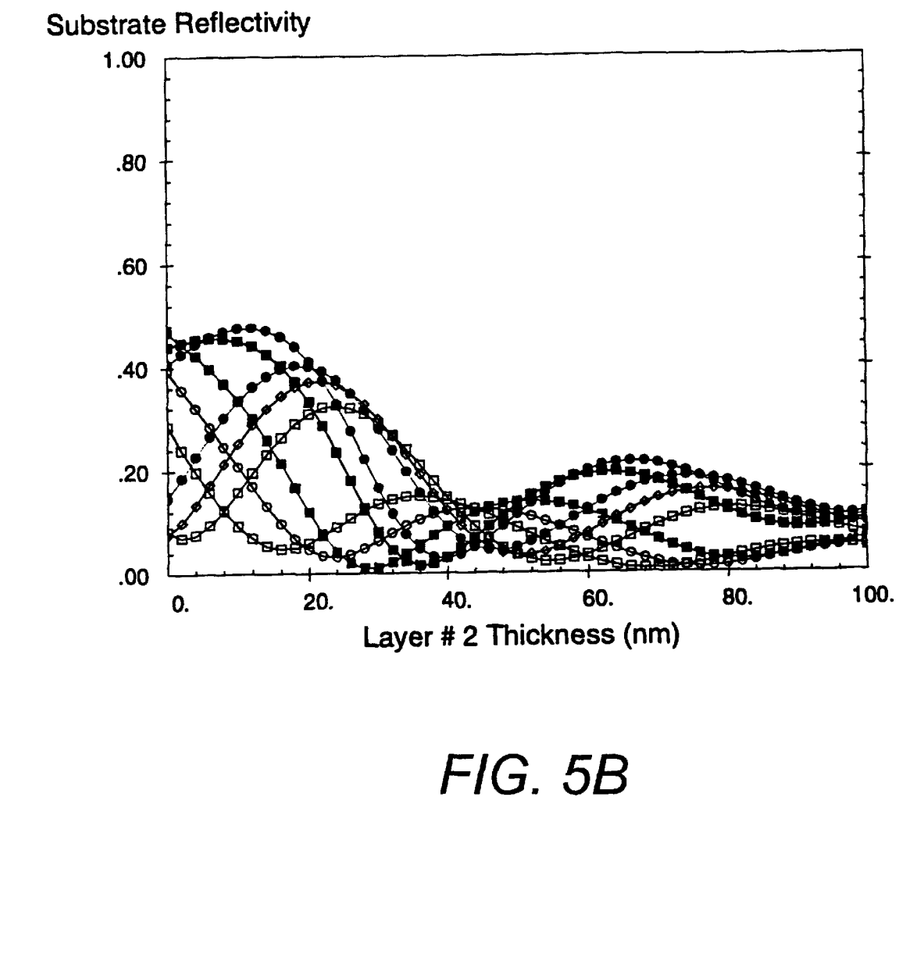

Referring to FIGS. 5A and 5B, FIG. 5A shows a graph of the reflectivity of silicon nitride versus the thickness of the silicon nitride hardmask layer for various substrate thicknesses. FIG. 5B shows a graph of the reflectivity of siliconoxynitride versus the thickness of the siliconoxynitride hardmask layer for various substrate thicknesses. The typical thickness of a hardmask layer used in integrated circuit fabrication is between 750 Angstroms (75 nanometers) to 1000 Angstroms (100 nanometers). The graphs of FIGS. 5A and 5B illustrate that at these thicknesses the siliconoxynitride hardmask layer has less reflectivity to light. When a photoresist layer is deposited on the siliconoxynitride hardmask layer 402 having relatively low reflectivity, such a photoresist layer conforms better to a desired pattern when the photoresist layer is exposed to light. Such higher conformance is especially important for small dimension integrated circuit fabrication.

Referring back to FIG. 4A, after a siliconoxynitride hardmask layer 402 is deposited as the top most hardmask layer, a first photoresist layer 404 is deposited for defining a first pattern of openings in the siliconoxynitride hardmask layer 402 and in turn in the top insulating layer 118. The first pattern etched in the siliconoxynitride hardmask layer 402 ultimately defines the location and size of openings in the top insulating layer 118.

In the case of a dual damascene etch process, the first pattern defines the location and size of openings for trench lines in the top insulating layer 118. The siliconoxynitride hardmask layer 402 is especially advantageous for its low reflectivity during the exposure of the first photoresist layer 402 to light for defining the first pattern. After such exposure to light, the first pattern of openings is etched from the first photoresist layer 402 and subsequently from the siliconoxynitride hardmask layer 402.

Figure 4B:
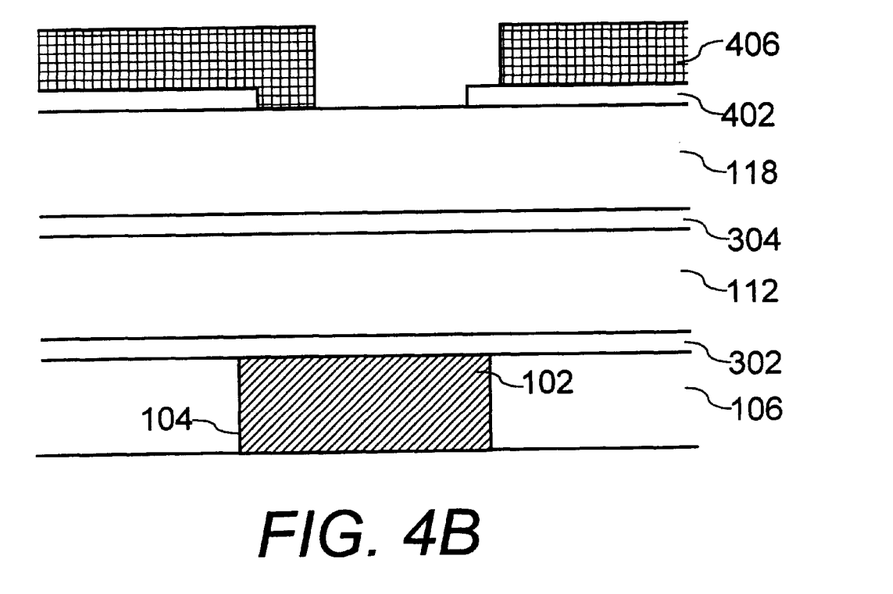

Referring to FIG. 4B, for etching contiguous trench line and via hole openings in a dual damascene etch process, the first photoresist layer 404 is removed, and a second photoresist layer 406 is deposited on the siliconoxynitride hardmask layer 402. The second photoresist layer 406 defines a second pattern that determines the location and size of openings in the bottom insulating layer 112. In the case of the dual damascene etch process, the second pattern defines via hole openings in the bottom insulating layer 112. The siliconoxynitride hardmask layer 402 again is especially advantageous for its low reflectivity during the exposure of the second photoresist layer 406 to light for defining the second pattern. After such exposure to light, the second pattern of openings is etched from the second photoresist layer 406 as shown in FIG. 4B.

Figure 4C:
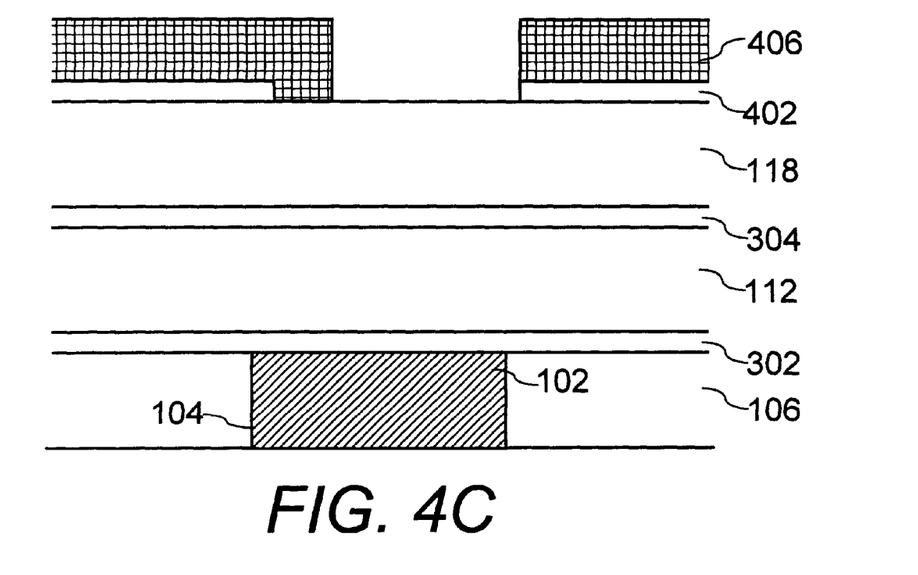
Figure 4D:
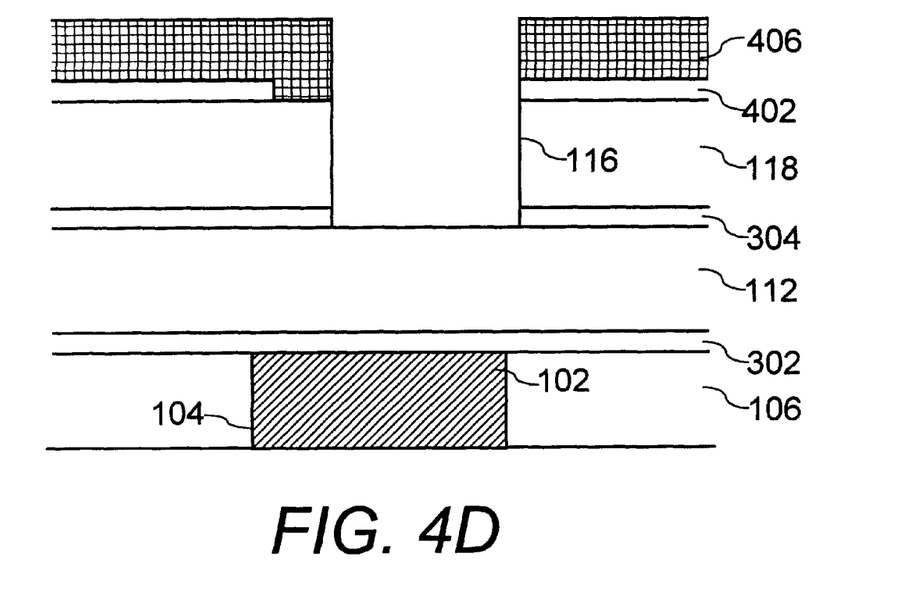

Referring to FIGS. 4B and 4C, any exposed part of the siliconoxynitride hardmask layer is etched away. Referring to FIG. 4D, openings are etched from any exposed parts of the top insulating layer 118 and eventually from the via hardmask 304.

Figure 4E:
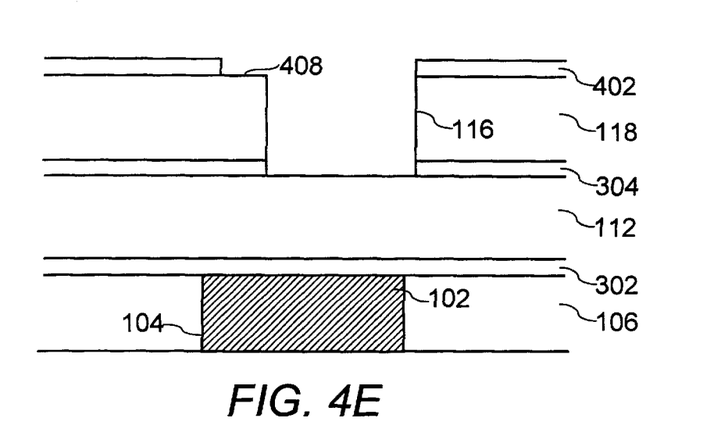
Figure 4F:
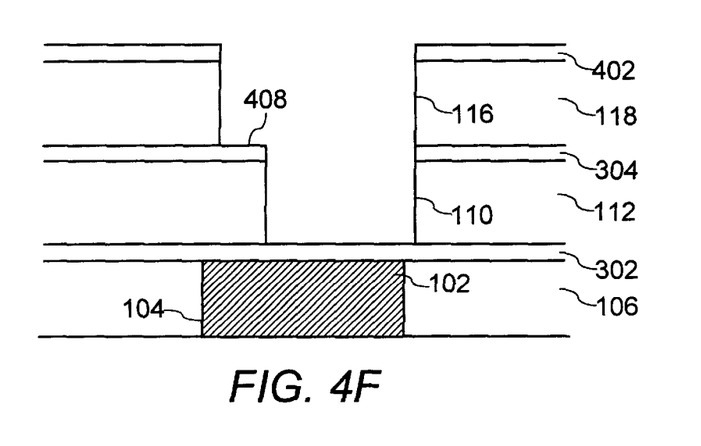
Figure 4G:
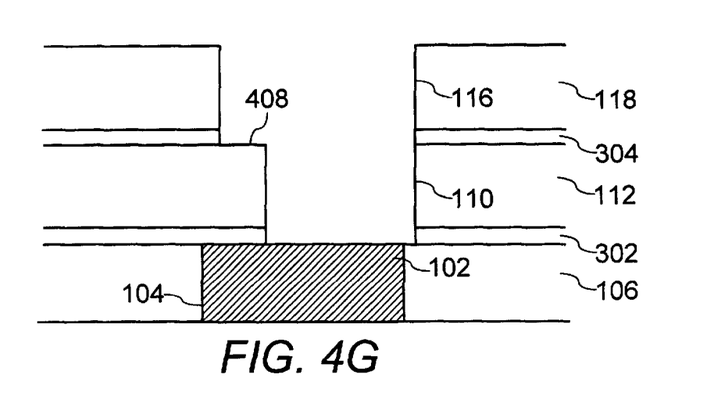

Referring to FIG. 4E, the second photoresist layer 406 is then removed. Referring to FIG. 4F, any exposed insulating material in the top insulating layer 118 or the bottom insulating layer 110 is etched. The first pattern in the siliconoxynitride hardmask layer 402 defines the trench line 116 in the top insulating layer 118, and the second pattern in the via hardmask layer 304 defines the via hole 110 in the bottom insulating layer 112. Referring to FIG. 4G, any exposed part of the hardmask layers 402, 304, and 302 are etched before filling the trench line 116 and the via hole 110 with copper.

Using siliconoxynitride as the top most hardmask layer 402 in this manner improves patterning of any photoresist layer that is deposited on such a hardmask layer since siliconoxynitride has relatively low reflectivity to light. In addition, referring to FIGS. 4E to 4G, because of mask misalignments during integrated circuit fabrication, the via hole 110 is typically not centered with the trench line 116 as known to one of ordinary skill in the art of integrated circuit fabrication. Thus, a step structure 408 between the top insulating layer 118 and the bottom insulating layer 112 results from the misalignment. The low reflectivity of the siliconoxynitride hardmask layer 402 is especially advantageous for patterning the second photoresist layer 406 over such a step 408. The low reflectivity of the siliconoxynitride hardmask layer 402 allows easier patterning over such a step 408.

Another advantage of using siliconoxynitride instead of silicon-nitride as the top hardmask layer 402 is that the siliconoxynitride etches off better than silicon-nitride.

The siliconoxynitride etches off to some extent even during etching of the via hole as illustrated in FIG. 4F. When a hardmask layer etches off more easily, the total thickness of the insulating materials from layers 106, 302, 112, 304, 118, and 402 is less. Less thickness leads to lower capacitance in integrated circuits which in turn leads to desired higher speed performance of integrated circuits.

The foregoing is by way of example only and is not intended to be limiting. For example, the present invention may be used for etching any type of openings with a hardmask layer as a top layer which will abut a photoresist layer during integrated circuit fabrication. Furthermore, as will be understood by those skilled in the art, the integrated circuit structures described herein may be made or used in the same way regardless of their position and orientation. Accordingly, it is to be understood that terms and phrases such as "bottom wall," "bottom," and "top" as used herein refer to the relative location and orientation of various portions of the structures with respect to one another, and are not intended to suggest that any particular absolute orientation with respect to external objects is necessary or required. The invention is limited only as defined in the following claims and equivalents thereof.

We claim:

1. A method for etching a plurality of openings in multiple levels in an integrated circuit, the method including the steps of:

A. depositing an antireflective hardmask layer over a first insulating layer;

B. depositing a first photoresist layer over the antireflective hardmask layer for defining a first pattern in the antireflective hardmask layer, the first pattern determining a location and size of openings in the first insulating layer;

C. exposing the first photoresist layer with light for defining the first pattern in the first photoresist layer, wherein the antireflective hardmask layer is antireflective to said light used for exposing the first photoresist layer, and wherein said antireflective hardmask layer abuts said first photoresist layer on the opposite side of the first photoresist layer that is exposed to said light;

D. etching the first pattern in the first photoresist layer;

E. etching the first pattern of openings in the antireflective hardmask layer as defined by the first photoresist layer after step D;

F. removing the first photoresist layer;

G. depositing a second photoresist layer over the antireflective hardmask layer after step F, the second photoresist layer defining a second pattern that determines a location and size of openings in a second insulating layer that is below the first insulating layer;

H. exposing the second photoresist layer with light for defining the second pattern in the second photoresist layer, wherein the antireflective hardmask layer is antireflective to said light used for exposing the second photoresist layer, and wherein a substantial portion of said antireflective hardmask layer abuts said second photoresist layer on the opposite side of the second photoresist layer that is exposed to said light;

I. etching the second pattern in the second photoresist layer; and

J. etching the second pattern of openings through the first insulating layer as defined by the second photoresist layer after step I.

2. The method of claim 1, further including the steps of:

K. removing the second photoresist layer; and

L. etching the first pattern of openings through the first insulating layer and etching the second pattern of openings through the second insulating layer.

3. The method of claim 2, further including the step of:

M. partially etching the antireflective hardmask layer during step L.

4. The method of claim 2, wherein the first pattern defines trench lines within the first insulating layer, and wherein the second pattern defines via holes within the second insulating layer.

5. The method of claim 4, wherein the trench lines and via holes are contiguous openings in a dual-damascene metallization structure.

6. The method of claim 5, wherein the antireflective hardmask layer is comprised of siliconoxynitride and has a thickness in the range of 750 Angstroms to 1000 Angstroms.

7. The method of claim 1, wherein the antireflective hardmask layer is comprised of siliconoxynitride and has a thickness in the range of 750 Angstroms to 1000 Angstroms.

8. A method for etching trench lines and via holes in a dual-damascene metallization structure in an integrated circuit, the method including the steps of:

A. depositing a siliconoxynitride hardmask layer over a trench insulating layer, wherein the siliconoxynitride hardmask layer has a thickness in the range of 750 Angstroms to 1000 Angstroms;

B. depositing a first photoresist layer over the siliconoxynitride hardmask layer for defining a trench line pattern in the siliconoxynitride hardmask layer, the trench line pattern determining a location and size of trench lines in the first insulating layer;

C. exposing the first photoresist layer with light for defining the first pattern in the first photoresist layer, wherein the siliconoxynitride hardmask layer is antireflective to said light used for exposing the first photoresist layer, and wherein said siliconoxynitride hardmask layer abuts said first photoresist layer on the opposite side of the first photoresist layer that is exposed to said light;

D. etching the first pattern in the first photoresist layer;

E. etching the first pattern of trench lines in the siliconoxynitride hardmask layer as defined by the first photoresist layer after step D;

F. removing the first photoresist layer;

G. depositing a second photoresist layer over the siliconoxynitride hardmask layer after step F, the second photoresist layer defining a second pattern that determines a location and size of via holes in a via insulating layer that is below the trench insulating layer;

H. exposing the second photoresist layer with light for defining the second pattern in the second photoresist layer, wherein the siliconoxynitride hardmask layer is antireflective to said light used for exposing the second photoresist layer, and wherein a substantial portion of said siliconoxynitride hardmask layer abuts said second photoresist layer on the opposite side of the second photoresist layer that is exposed to said light;

I. etching the second pattern in the second photoresist layer;

J. etching the second pattern of openings through the first insulating layer as defined by the second photoresist layer after step I, the first pattern defining openings for trench lines that are contiguous with opening for via holes defined by the second pattern;

K. removing the second photoresist layer;
L. etching the first pattern of trench lines through the first insulating layer and etching the second pattern of via holes through the second insulating layer; and
M. partially etching the siliconoxynitride hardmask layer during step L.

* * * * *